(12) United States Patent
Mellinger et al.

(10) Patent No.: US 9,292,076 B2
(45) Date of Patent: Mar. 22, 2016

(54) FAST RECALIBRATION CIRCUITRY FOR INPUT/OUTPUT (IO) COMPENSATION FINITE STATE MACHINE POWER-DOWN-EXIT

(71) Applicants: Todd W. Mellinger, Fort Collins, CO (US); Nicholas J. Denier, Beaverton, OR (US)

(72) Inventors: Todd W. Mellinger, Fort Collins, CO (US); Nicholas J. Denier, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 255 days.

(21) Appl. No.: 14/027,682

(22) Filed: Sep. 16, 2013

(65) Prior Publication Data

US 2015/0082011 A1   Mar. 19, 2015

(51) Int. Cl.
*G06F 1/32* (2006.01)
*G11C 29/02* (2006.01)

(52) U.S. Cl.
CPC ............ *G06F 1/3243* (2013.01); *G06F 1/3287* (2013.01); *G11C 29/021* (2013.01); *G11C 29/022* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 8,769,338 B1 * | 7/2014 | Yeung et al. | 714/22 |
| 2013/0262791 A1 * | 10/2013 | Henderson et al. | 711/154 |
| 2013/0346733 A1 * | 12/2013 | Groot et al. | 713/1 |

* cited by examiner

*Primary Examiner* — Paul Yanchus, III
(74) *Attorney, Agent, or Firm* — Lowenstein Sandler LLP

(57) ABSTRACT

Fast recalibration circuitry for input/output (IO) compensation finite state machine power-down exit is described. The fast recalibration circuitry includes a finite state machine having a volatile memory to store an IO compensation setting and a power supply coupled to the volatile memory to provide power to the volatile memory. The fast recalibration circuitry includes a persistent memory coupled to the volatile memory and one or more circuits, coupled to the volatile memory and the persistent memory, to identify an event to enter a power-down mode, wherein the power-down mode comprises the power supply removing power from the volatile memory and transfer the IO compensation setting in the volatile memory to the persistent memory prior to the power supply removing the power from the volatile memory.

18 Claims, 11 Drawing Sheets

FAST RECALIBRATION CIRCUITRY FOR INPUT/OUTPUT (IO) COMPENSATION FINITE STATE MACHINE POWER-DOWN-EXIT

TECHNICAL FIELD

Embodiments described herein generally relate to finite state machines and, more specifically, relate to a finite state machine including fast recalibration circuitry for input/output (IO) compensation for power-down exit.

BACKGROUND

Traditional CPU (central processing unit) IO (input/output) physical layer designs have settings for transmitter drive-strength that can be adjusted to keep the transmitter within certain (various) electrical specifications. The adjustment settings can either be statically applied (i.e., configuration) or dynamically adjusted to account for variation/fluctuation in process, voltage, and temperature. Such dynamic adjustment is generally known as "IO compensation" and is typically performed by dedicated CPU hardware known as an "IO Compensation Finite State Machine (FSM)." The FSMs can compute the desired transmitter drive-strength settings, which may then be employed by the actual transmitter circuits on the CPU IO ports. The FSMs generally employ a searching algorithm, iterating of setting values, and measuring of results until an acceptable finalized setting has been attained. When re-calibration (or re-compensation) is desired, the search algorithm is usually repeated and a new setting is found. Variations of traditional re-calibration schemes exist, such as continuously operating FSMs that immediately track fluctuations in voltage and temperature. Traditionally, when an IO compensation FSM is shut down (e.g., enters "reset" or is powered-down), the FSM state, which may include the settings for compensation, is typically lost. Upon power-down exit, the FSM restarts "from scratch" employing the full compensation search-algorithm, which may negatively impact power-down exit latencies, since IO compensation precedes the commencement of IO bus traffic. Conventional solutions do not usually preserve the previously attained compensation settings (prior to power-down) and have generally suffered latency costs.

DESCRIPTION OF EMBODIMENTS

Figure 1:
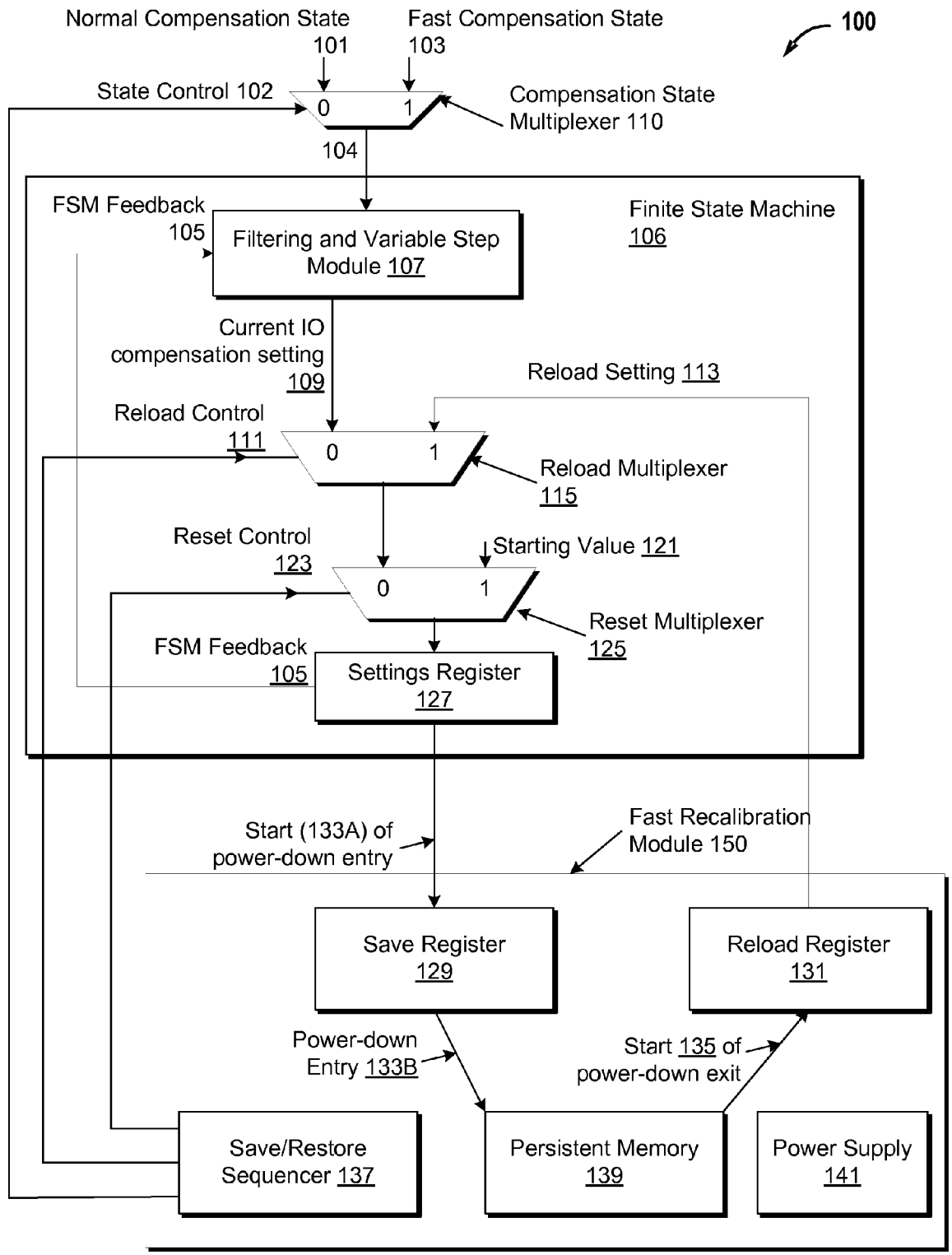
FIG. 1 is a block diagram of one embodiment of fast recalibration circuitry for input/output (IO) compensation finite state machine (FSM) power-down exit.

Technologies for reducing the latency penalties of re-calibrating input/output (IO) compensation settings are described. Processes in the manufacturing of CPUs may vary and CPUs may operate IOs at different voltages and temperatures. The CPU's operation in various environment conditions (e.g., voltage, temperature) may cause the impedance of various IO circuits to change. A CPU can include an IO compensation finite state machine (FSM) for calibrating (compensating) the drive strength of an IO driver to match a specific resistance/impedance. Generally, a CPU IO physical layer design may include an off-die reference resistor as a reference for the FSM to use to determine how or where to calibrate impedance for the IO drivers. For example, most commonly, the impedance to be matched may be 50 ohms. The CPU can include a circuit to read the reference resistance (e.g., 50 ohms). The CPU's finite state machine can change the hardware settings (e.g., resistance settings) until the drive strength of an IO driver is matched to the 50 ohm reference resistance. The FSM can adjust for process, voltage, and temperature variation on the CPU.

The changed hardware settings for impedance matching hereinafter are referred to as IO compensation settings. As temperature drifts, the FSM may continuously or periodically re-calibrate the IO compensation settings. For example, as temperature changes from 10 degrees Celsius to 80 degrees Celsius, the FSM may continuously or periodically adjust the IO compensation settings to match the 50 ohms reference impedance.

In the case of low power applications, where a particular IO may not be in use, the power to the CPU that corresponds to the unused IO may be shut down (powered-down). For example, the power supply to the IO may be completely turned off and the power to the FSM may also be turned off. A power-down hereinafter refers to removing power to the FSM.

When an IO compensation FSM is shut down (e.g., power-down entry), implementations of the present disclosure can save the IO compensation settings in the memory of the FSM to persistent memory, such that the IO compensations settings are not lost. Implementations of the disclosure include circuitry and logic in the FSM for fast recalibration. Implementations include circuitry and logic to store the IO compensation settings, which match the reference impedance, in a persistent storage device prior to the data being lost in the FSM as the FSM enters power-down. When the power is supplied to the FSM, implementations of the disclosure include circuitry and logic to retrieve the IO compensation settings from the persistent memory and reload the IO compensation settings in the FSM. The reloaded IO compensation settings can account for a large impedance variation that is attributed to process and/or voltage variations on the CPU and can serve as a starting point for the calibration process. Since the reloaded settings already compensate for the impedance variation associated with process and/or voltage variations, implementations of the present disclosure need only to adjust for temperature changes on the CPU. As such, implementations of the present disclosure can substantially reduce the latency penalties of re-calibrating IO compensation settings after shut-down and can allow the IOs to be used much sooner than traditional compensation solutions. Implementations of the disclosure take advantage of the previously stored IO compensation values, which already compensate for larger impedance variations (e.g., process and/or voltage related impedance variations), to allow for a very short re-calibrate time, for example, to compensate for temperature variations.

FIG. 1 is a block diagram of an embodiment of fast recalibration circuitry 100 for IO compensation finite state machine (FSM) power-down exit in accordance with the present disclosure. In one implementation, a CPU includes the fast recalibration circuitry 100. The fast recalibration circuitry 100 can include a finite state machine 106 and circuitry (e.g., compensation state multiplexer 110, fast recalibration module 150) to substantially reduce the latency penalties of re-calibrating IO compensation settings after powering-down. The fast recalibration circuitry 100 can perform a quick version of re-compensation using the compensation state multiplexer 110, the fast recalibration module 150, and the FSM 106. In one implementation, the FSM 106 includes a filtering and variable step module 107, a reload multiplexer 115, a reset multiplexer 125, and a settings register 127. The settings register 127, the filtering and variable step module 107, reload multiplexer 115, and reset multiplexer 125 may physically exist within the FSM hierarchy and are shown explicitly for illustrative purposes. In other implementations, the compensation state multiplexer 110 resides as part of the FSM 106. In other implementations, one or more of the reload multiplexer 115, the compensation state multiplexer 110, and the reset multiplexer 125 do not reside as part of the FSM 106.

The settings register 127 can contain the current IO compensation settings 109 at any given time. The settings register 127 can include a FSM feedback 105 to feedback the current IO compensation setting 109 into the filtering and variable step module 107. The filtering and variable step module 107 can receive measurements (e.g., voltage measurements, temperature measurements, process measurements, reference resistance, etc.) and adjust the current IO compensation setting 109, for example, received via the FSM feedback 105, to account for variation and/or fluctuation in the measurements. The filtering and variable step module 107 can receive measurements from hardware components on the CPU. The adjustment of the current IO compensation setting 109 can be iterative until a desired impedance match is reached.

The compensation state multiplexer 110 can set the FSM 106 in a normal compensation state 101 or a fast compensation state 103 based on input (e.g., state control 102) from a save/restore sequencer 137 circuit. In one implementation, the compensation state is defaulted to normal compensation state 101. The save/restore sequencer 137 circuit can include hardware, circuitry, components and/or logic for managing the saving and reloading of the current IO compensation setting 109.

Figure 2:
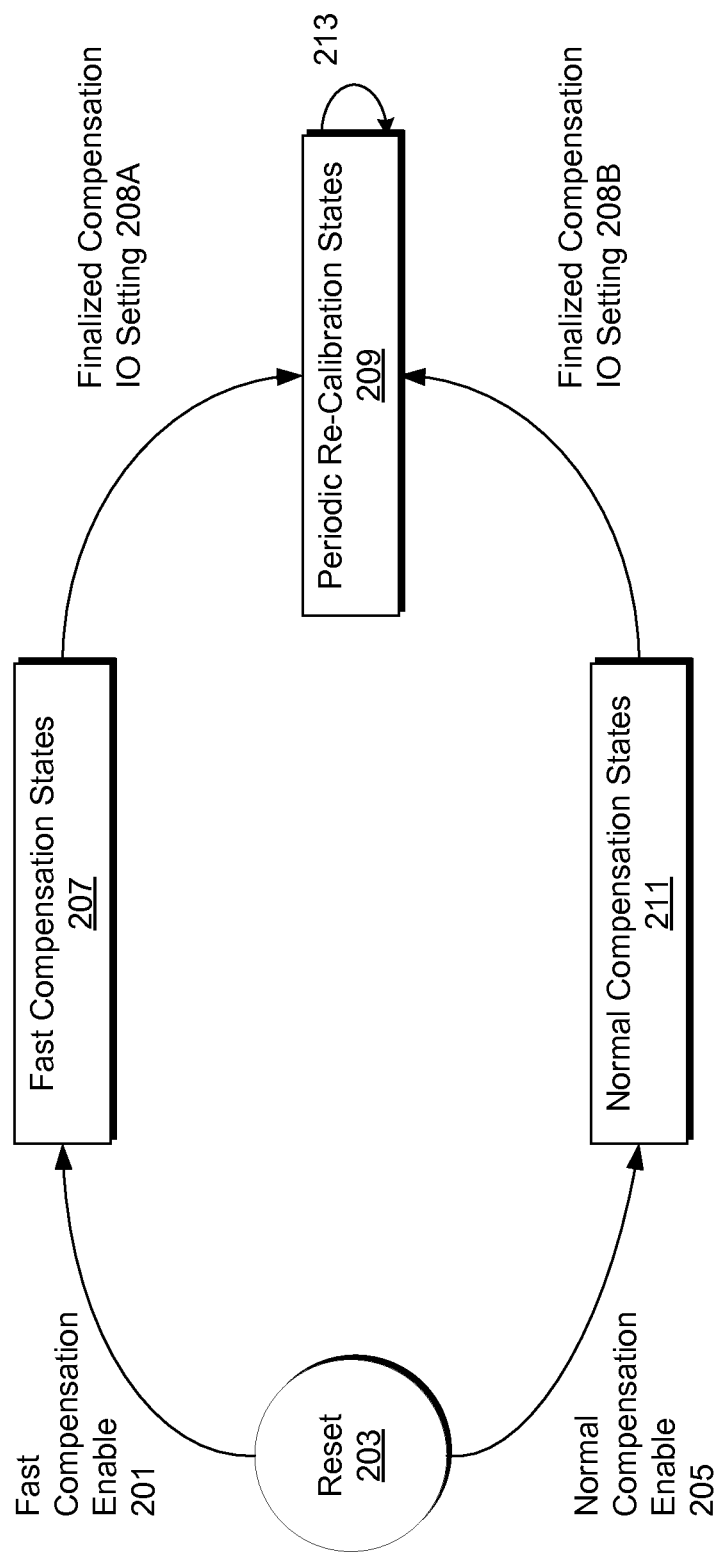
FIG. 2 is a block diagram of one embodiment of various compensation states for fast recalibration for IO compensation FSM power-down exit.

FIG. 2 is a block diagram illustrating an example of the two states for the FSM. Various implementations of the FSM can use combined states. When the FSM comes out of reset 203, also referred to as power-down exit, the FSM can be enabled for either fast compensation enable 201 or normal compensation enable 205. When the FSM is set for fast compensation enable 201, the FSM enters fast compensation states 207 to determine a finalized compensation IO compensation setting 208A. When the FSM is set for normal compensation enable 205, the FSM enters normal compensation states 211 to determine a finalized compensation IO compensation setting 208B. When the FSM determines a finalized compensation IO compensation setting (e.g., setting 208A or setting 208B), the FSM can enter periodic re-calibration states 209 to periodically adjust 213 the finalized compensation IO compensation setting (e.g., setting 208A or setting 208B). For example, as temperature changes, the FSM can periodically adjust 213 setting 208A or setting 208B. When the FSM is in the normal compensation states 211, the FSM can start from scratch to calibrate the transmitter driver strength. The fast compensation states 207 can take advantage of a stored IO compensation setting, which is reloaded into the FSM, to reduce the calibration time.

Returning to FIG. 1, the fast recalibration module 150, the reload multiplexer 115, and the compensation state multiplexer 110 can start the FSM 106 in a fast compensation state 103 using a reloaded IO compensation setting (e.g., reload setting 113), which is a restored setting that was saved prior to shut-down. The reload setting 113 can be fed from the settings register 127 to the filtering and variable step module 107 via the FSM feedback 105 path. The filtering and variable step module 107 can take advantage of the reloaded setting (e.g., reload setting 113) to operate the FSM 106 in a low-latency manner.

The filtering and variable step module 107 can filter noise from the setting and can adjust the step size for determining an appropriate finalized compensation IO compensation setting. The filtering and variable step module 107 can receive input 104 indicating whether the FSM 106 is in a normal compensation state 101 or a fast compensation state 103. Based on the input 104, the filtering and variable step module 107 can perform calibration operations that correspond to the normal compensation state 101 or the fast compensation state 103. For example, the filtering and variable step module 107 can include logic and hardware to adjust the calibration algorithm accordingly when the FSM 106 is enabled for the fast compensation state 103. The calibration algorithm may be adjusted, for example, by using fewer FSM iterations (or "samples"), using reduced filtering on the samples, and using modified FSM settings for adjustment step-sizes, etc. One implementation of components for the filtering and variable step module for a fast compensation state is described in greater detail below in conjunction with FIG. 3.

The fast recalibration module 150 can include one or more registers (e.g., save register 129, reload register 131), a save/restore sequencer 137 circuit, one or more persistent memory 139, and a power supply 141. In one implementation, the save register 129 and the reload register 131 may be combined into a single register. The registers may be volatile storage devices.

The save/restore sequencer 137 circuit can provide a state control 102 for the compensation state multiplexer 110 for enabling the normal compensation state 101 or the fast compensation state 103. The save/restore sequencer 137 circuit can also provide a reload control 111 for the reload multiplexer 115 to indicate when the FSM 106 should use a reload setting 113. The save/restore sequencer 137 circuit can also provide a reset control 123 for the reset multiplexer 125 to indicate when the FSM 106 should use a starting value 121. When the FSM 106 is not reloaded with a reload setting 113, the FSM 106 can use a specified starting value 121. The starting value 121 can be a programmable value. The starting value 121 can be a user-configurable value. One implementation of the FSM using a reload setting or a starting value is described in greater detail below in conjunction with FIG. 3.

The save/restore sequencer 137 circuit can manage the saving and reloading of the current IO compensation setting 109. For example, the save/restore sequencer 137 circuit may detect an event for the FSM 106 to enter a power-down mode. In one implementation, the FSM 106 does not include a save register 129, and the settings register 127 value is fed directly into the persistent memory 139 for power-down entry 133A, B. For example, the FSM 106 and the persistent memory 139 may use the same clock domain, and the save/restore sequencer 137 circuit may read the value in the settings register 127 and directly write the same value in the persistent memory 139.

In another implementation, the FSM 106 and the persistent memory 139 may not use the same clock domain and directly writing of the data in the settings register 127 to the persistent memory 139 has an increased chance of losing data bits. The circuitry 100 can include a save register 129 to decrease the chance of losing data when copying the contents of the settings register 127 to the persistent memory 139. The save/restore sequencer 137 circuit may read the value in the settings register 127 and write the same value to the save register 129. The save/restore sequencer 137 circuit may then read the value in the save register and write the same value to the persistent memory 139.

The save register 129 can capture the current IO compensation settings from the settings register 127 at the start 133A of power-down entry. In one implementation, the save register 129 is a free-running shadow register that reflects a cycle-delayed version of the settings register 127. In another implementation, the save register 129 periodically samples the settings register 127 using one or more cross-clock-domain handshaking schemes. In another implementation, the save register 129 is enabled to latch-in the settings register 127 only upon signal indication for power management sequencing engine, for example, in anticipation of an upcoming power-down entry 133A,B.

The persistent memory 139 can store the current IO compensation settings during IO power-down entry 133. The persistent memory 139 can be, for example, and is not limited to an on-CPU array, a (not powered-down) register file or array, ROM, main memory, etc. The power supply 141 can supply power to the persistent memory 139. The power supply 141 is separate from a power supply that supplies power to the settings register 127.

The reload register 131 can reload the current IO compensation setting 109 in the persistent memory 139 at the start 135 of power-down exit to the settings register 127 using a reload setting 113 path. The current IO compensation setting 109 can be reloaded from the reload multiplexer 115 to the reset multiplexer 125 to the settings register 127 prior to the save/reload sequencer 137 circuit enabling the FSM 106 in a fast compensation state 103.

Figure 3:
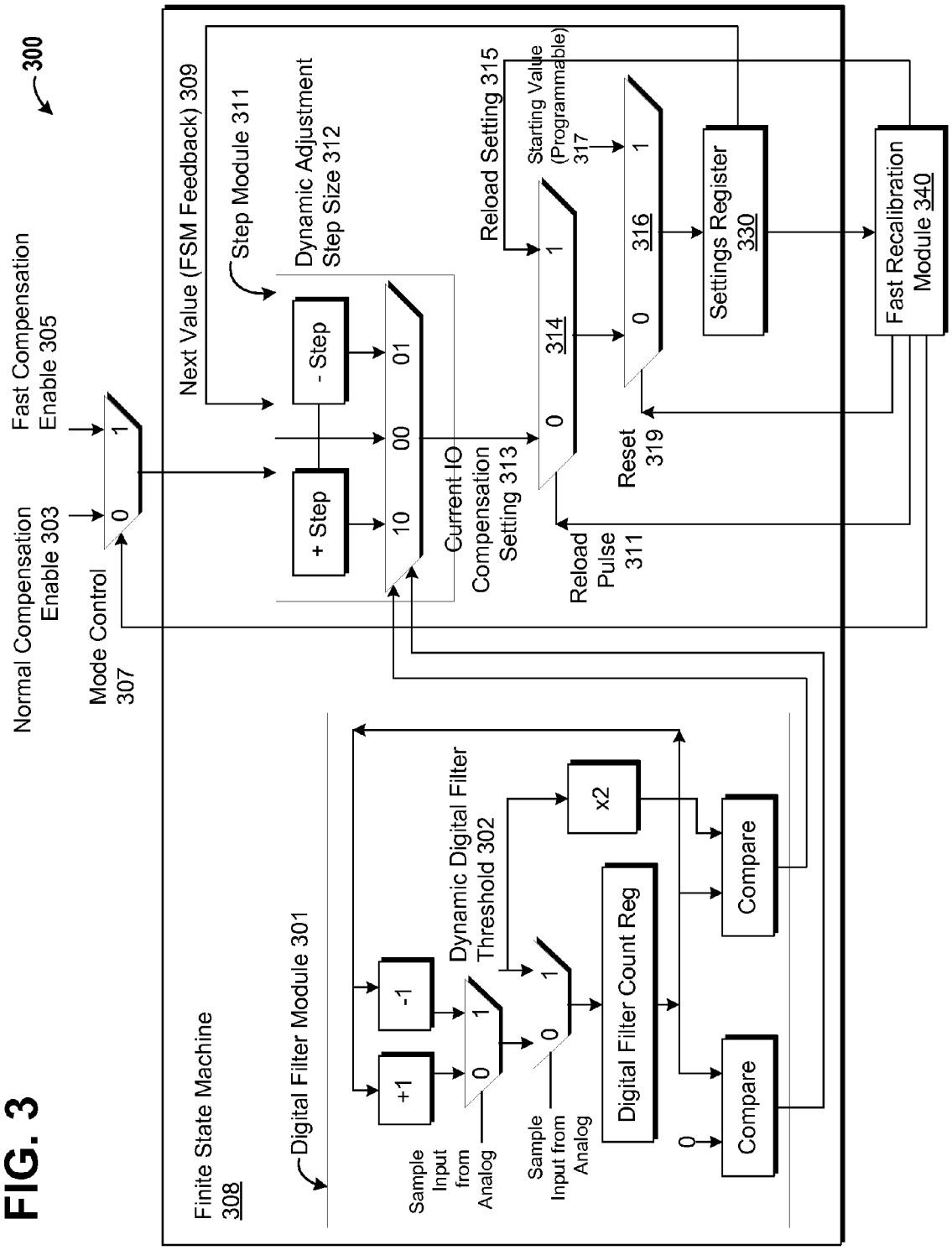
FIG. 3 is a block diagram of one embodiment of circuitry for digital filtering and dynamic step adjustment for fast recalibration for IO compensation FSM power-down exit.

FIG. 3 is a block diagram of an embodiment of fast recalibration circuitry 300 for digital filtering and dynamic step adjustments for fast recalibration for IO compensation FSM power-down exit in accordance with the present disclosure. The fast recalibration circuitry 300 can include finite state machine (FSM) 308 that includes a digital filter module 301 for digital filtering, a step module 311 for providing variable step sizes, a reload multiplexer 314, a reset multiplexer 316, and a settings register 330. Other implementations can include one or more variations in implementation design details, such as digital filter type/style.

The fast recalibration circuitry 300 can include a fast recalibration module 340 (e.g., fast recalibration module 150 in FIG. 1) to set the mode of the FSM 308 in either normal compensation enable 303 or fast compensation enable 305. The fast recalibration module 340 can include a save/restore sequencer circuit (e.g., save/restore sequencer 137 circuit in FIG. 1) to provide a mode control 307 for enabling normal compensation mode or fast compensation mode. If the FSM 308 has not stored a previous IO compensation setting, the mode control 307 can set the FSM 308 to normal compensation enable 303. If the FSM 308 has stored a previous IO compensation setting, the mode control 307 can set the FSM 308 to fast compensation enable 305. The save/restore sequencer in the fast recalibration module 340 can also provide controls (e.g., reload pulse 311, reset 319) to indicate when the FSM 308 should use a reload setting 315 or a starting value 317.

When the FSM 308 is in the normal compensation states, the FSM 308 can start from scratch to calibrate the transmitter driver strength. In normal compensation states, the FSM 308 can use a starting value 317, which can be programmable and/or configurable (e.g., user configurable) to begin the calibration. The starting value 317 can be fed into the step module 311 as a next value (FSM feedback 309). The step module 311 can create a dynamic adjustment step-size 312 to adjust the input (e.g., next value 309). The dynamic adjustment step-size 312 can be based on whether the FSM 308 is set for normal compensation enable 303 or fast compensation enable 305. For example, when the FSM 308 is set for normal compensation enable 303, the step module 311 may start the dynamic adjustment step-size 312 from large steps that become finer-sized (smaller sized) steps as the target impedance is approached.

The FSM 308 can take sample measurements to determine the new, post-power-down-exit IO compensation target. For example, the normal compensation states may take, for example, 256 closed-loop measurement sample measurements. To reduce error from possibly bad samples, the FSM 308 can include a digital filter (e.g., digital filter module 301) to ensure consistency of samples prior to the FSM 308 making any decisions or adjustments to the current IO compensation setting. The digital filter module 301 can be configurable. For example, the digital filter module 301 can be coupled to a data store that stores configuration data indicating a dynamic digital filter threshold 302. The threshold 302 can be user configurable.

In one example, with digital filtering, the maximum (best case) number of decisions/adjustments made by the FSM 308 throughout the normal compensation states may be "64". The 64 decisions may be ample for full, first-time compensation from the starting value 317 to reach an appropriate finalized compensation IO compensation setting.

In another example, when the FSM 308 is set for fast compensation enable 305, the FSM 308 can use a reload setting 315 to begin the calibration. The reload setting 315 may be stored in the settings register 330 and can be fed into the step module 311 as a next value (FSM feedback 309). In the fast compensation states, the step module 311 may take advantage of the reload setting 315 and may use, for example, a step-size of "2" to reach a finalized compensation IO compensation setting (e.g., current IO compensation setting 313).

The fast compensation states can take advantage of the stored IO compensation setting (e.g., reload setting 315) because the reload setting 315 may be reasonably close to the new, post-power-down-exit IO compensation target. Even with possible temperature drifts of 100 degrees Celsius, the IO compensation targets may only be expected to drift, for example, by 8-12 setting values (per circuit simulations). The fast compensation states can use the reload setting 315 to reduce the number of decisions/adjustments when calibrating for transmitter drive strength. For example, the fast compensation states may execute 3 decisions/adjustments, rather than the 64 decisions/adjustments that may be executed in the normal compensations states.

The fast compensation states can take advantage of anticipated quiet supply rails during power-down-exit to reduce the amount of digital filtering by the digital filter module 301 to a portion (e.g., 25%) of the digital filtering used in normal compensation states, which can result in fewer closed-loop measurement samples. For example, the fast compensation states may include, for example, 6 closed-loop measurement samples. Since each sample may take approximately four FSM clocks, and may operate, for example, at 100 MHz, the fast compensation states can reduce the calibration time, for example, from 10,960 ns in the normal compensation states to 320 ns in the fast compensation states.

Figure 4:
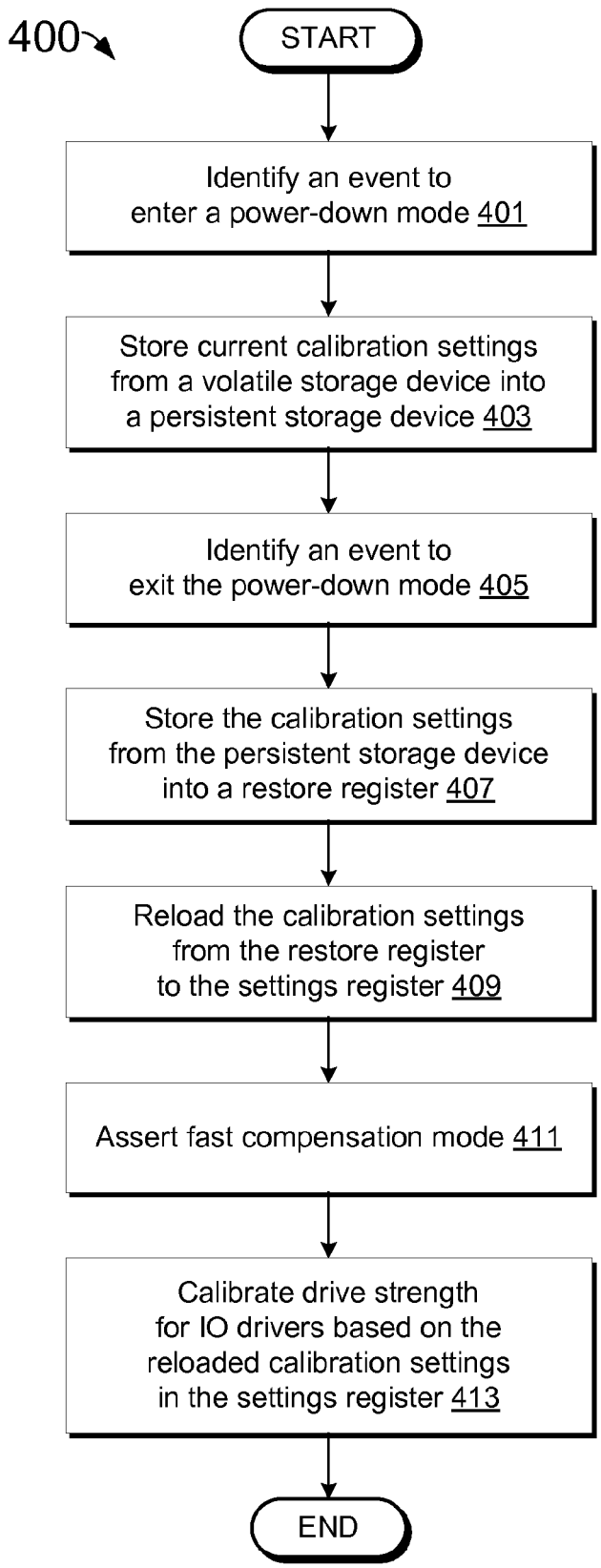
FIG. 4 is a flow diagram illustrating a method for using a stored IO compensation setting for fast recalibration for IO compensation FSM power-down exit according to an embodiment.

FIG. 4 is a flow diagram of method 400 according to some embodiments. Method 400 may be performed by processing logic that may comprise hardware (e.g., circuitry, dedicated logic, programmable logic, microcode, etc.), software (such as instructions run on a processing device), firmware or a combination thereof. In one embodiment, method 400 is performed by a fast recalibration circuitry 100 of FIG. 1. In another embodiment, the method 400 is performed by the fast recalibration circuitry 300 of FIG. 3.

Referring to FIG. 4, the method 400 begins by the fast recalibration circuitry identifying an event to enter a power-down mode (block 401). The fast recalibration circuitry can store current calibrations settings that are in a volatile storage device into a persistent storage device (block 403). For example, the current calibrations settings in a settings register may be transferred and/or copied to a persistent storage device.

The fast recalibration circuitry identifies an event to exit the power-down mode (block 405) and stores the calibration settings from the persistent storage device into a restore register (block 407). The fast recalibration circuitry reloads the calibrations settings from the restore register to the settings register (block 409) and asserts fast compensation mode (block 411) to have the fast recalibration circuitry perform calibration using fast compensation states. In fast compensation states, the fast recalibration circuitry calibrates the drive strength for input/output (IO) drivers based on the reloaded calibration settings in the settings register (block 413).

Figure 5:
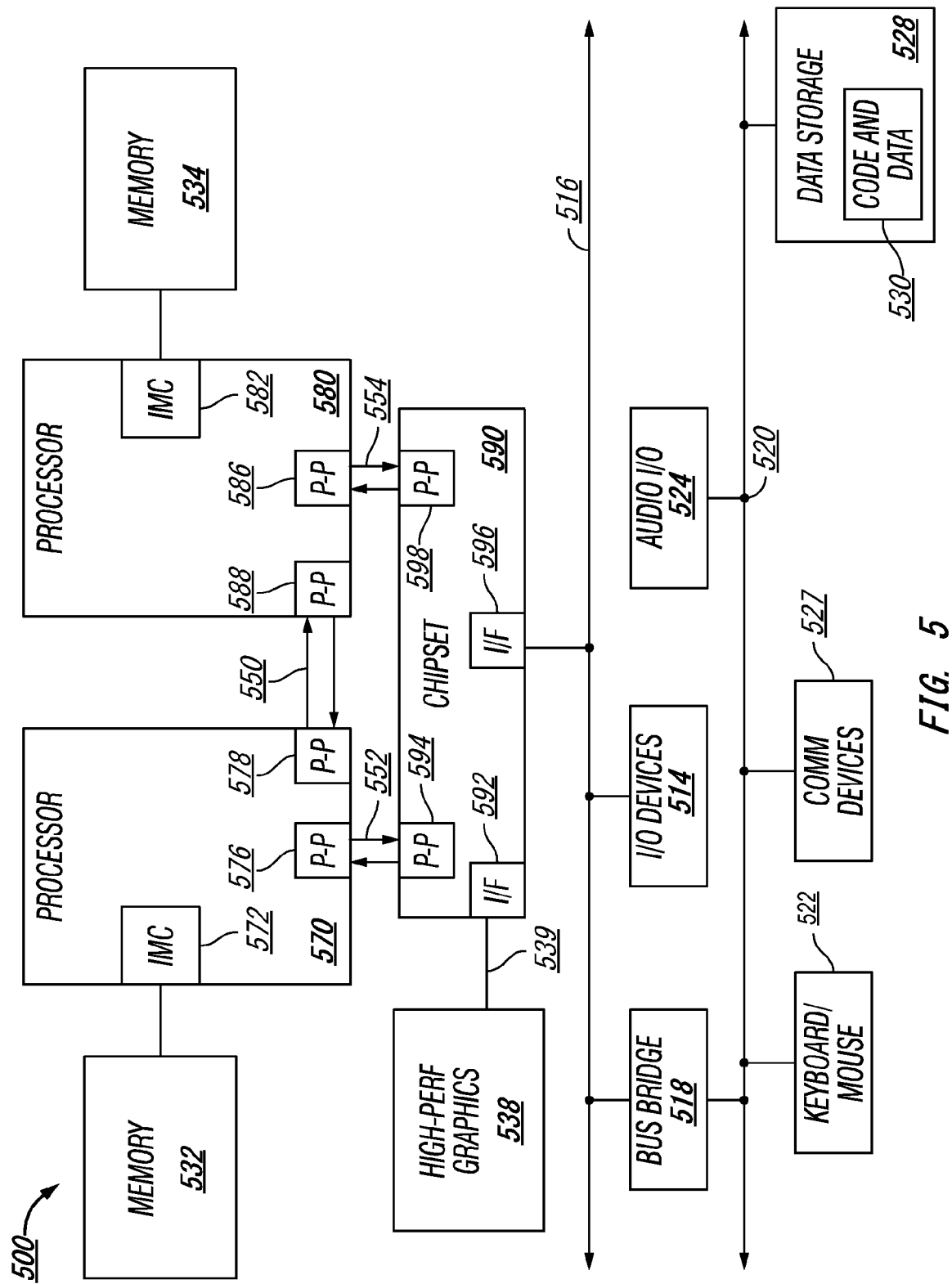
FIG. 5 is a block diagram of a system in accordance with an embodiment of the present disclosure.

FIG. 5 is a block diagram of a system 500 in accordance with an embodiment of the present invention. As shown in FIG. 5, multiprocessor system 500 is a point-to-point interconnect system, and includes a first processor 570 and a second processor 580 coupled via a point-to-point interconnect 550.

While shown with only two processors 570, 580, it is to be understood that the scope of the present invention is not so limited. In other embodiments, one or more additional processors may be present in a given processor.

Processors 570 and 580 are shown including integrated memory controller units 572 and 582, respectively. Processor 570 also includes as part of its bus controller units point-to-point (P-P) interfaces 576 and 578; similarly, second processor 580 includes P-P interfaces 586 and 588. Processors 570, 580 may exchange information via a point-to-point (P-P) interface 550 using P-P interface circuits 578, 588. As shown in FIG. 5, IMCs 572 and 582 couple the processors to respective memories, namely a memory 532 and a memory 534, which may be portions of main memory locally attached to the respective processors.

Processors 570, 580 may each exchange information with a chipset 590 via individual P-P interfaces 552, 554 using point to point interface circuits 576, 594, 586, 598. Chipset 590 may also exchange information with a high-performance graphics circuit 538 via a high-performance graphics interface 539.

A shared cache (not shown) may be included in either processor or outside of both processors, yet connected with the processors via P-P interconnect, such that either or both processors' local cache information may be stored in the shared cache if a processor is placed into a low power mode.

Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present invention is not so limited.

As shown in FIG. 5, various I/O devices 514 may be coupled to first bus 516, along with a bus bridge 518 which couples first bus 516 to a second bus 520. In one embodiment, second bus 520 may be a low pin count (LPC) bus. Various devices may be coupled to second bus 520 including, for example, a keyboard and/or mouse 522, communication devices 527 and a storage unit 528 such as a disk drive or other mass storage device which may include instructions/code and data 530, in one embodiment. Further, an audio I/O 524 may be coupled to second bus 520. Note that other architectures are possible. For example, instead of the point-to-point architecture of FIG. 5, a system may implement a multi-drop bus or other such architecture.

Figure 6:
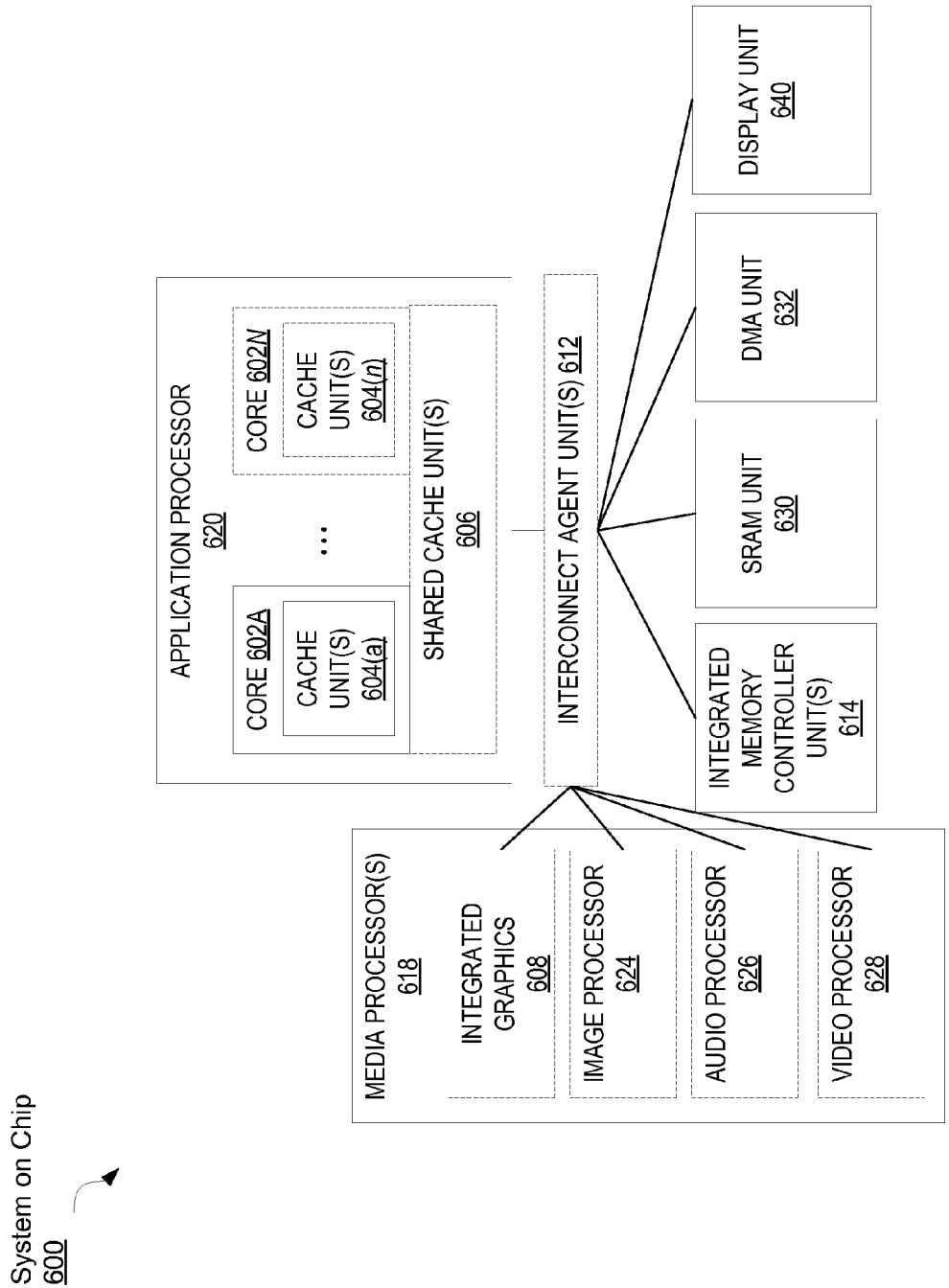
FIG. 6 is a block diagram of a SOC in accordance with an embodiment of the present disclosure.

FIG. 6 is a block diagram of a SOC 600 in accordance with an embodiment of the present disclosure. Dashed lined boxes are optional features on more advanced SOCs. In FIG. 6, an interconnect agent unit(s) 612 is coupled to: an application processor 620 which includes a set of one or more cores 602A-N and shared cache unit(s) 606; an integrated memory controller unit(s) 614; a set or one or more media processors 618 which may include integrated graphics logic 608, an image processor 624 for providing still and/or video camera functionality, an audio processor 626 for providing hardware audio acceleration, and a video processor 628 for providing video encode/decode acceleration; an static random access memory (SRAM) unit 630; a direct memory access (DMA) unit 632; and a display unit 640 for coupling to one or more external displays.

The memory hierarchy includes one or more levels of cache within the cores, a set or one or more shared cache units 606, and external memory (not shown) coupled to the set of integrated memory controller units 614. The set of shared cache units 606 may include one or more mid-level caches, such as level 2 (L2), level 3 (L3), level 4 (L4), or other levels of cache, a last level cache (LLC), and/or combinations thereof.

In some embodiments, one or more of the cores 602A-N are capable of multithreading.

The system agent 610 includes those components coordinating and operating cores 602A-N. The system agent unit 610 may include for example a power control unit (PCU) and a display unit 640. The PCU may be or include logic and components needed for regulating the power state of the cores 602A-N and the integrated graphics logic 608. The display unit is for driving one or more externally connected displays.

The cores 602A-N may be homogenous or heterogeneous in terms of architecture and/or instruction set. For example, some of the cores 602A-N may be in order while others are out-of-order. As another example, two or more of the cores 602A-N may be capable of execution the same instruction set, while others may be capable of executing only a subset of that instruction set or a different instruction set.

The application processor 620 may be a general-purpose processor, such as an Atom™, Core™ i3, i5, i7, 2 Duo and Quad, Xeon™, Itanium™, XScale™ or StrongARM™ processor, which are available from Intel Corporation, of Santa Clara, Calif. Alternatively, the application processor 620 may be from another company, such as ARM Holdings, Ltd, MIPS, etc. The application processor 620 may be a special-purpose processor, such as, for example, a network or communication processor, compression engine, graphics processor, co-processor, embedded processor, or the like. The application processor 620 may be implemented on one or more chips. The application processor 620 may be a part of and/or may be implemented on one or more substrates using any of a number of process technologies, such as, for example, BiCMOS, CMOS, or NMOS.

Figure 7:
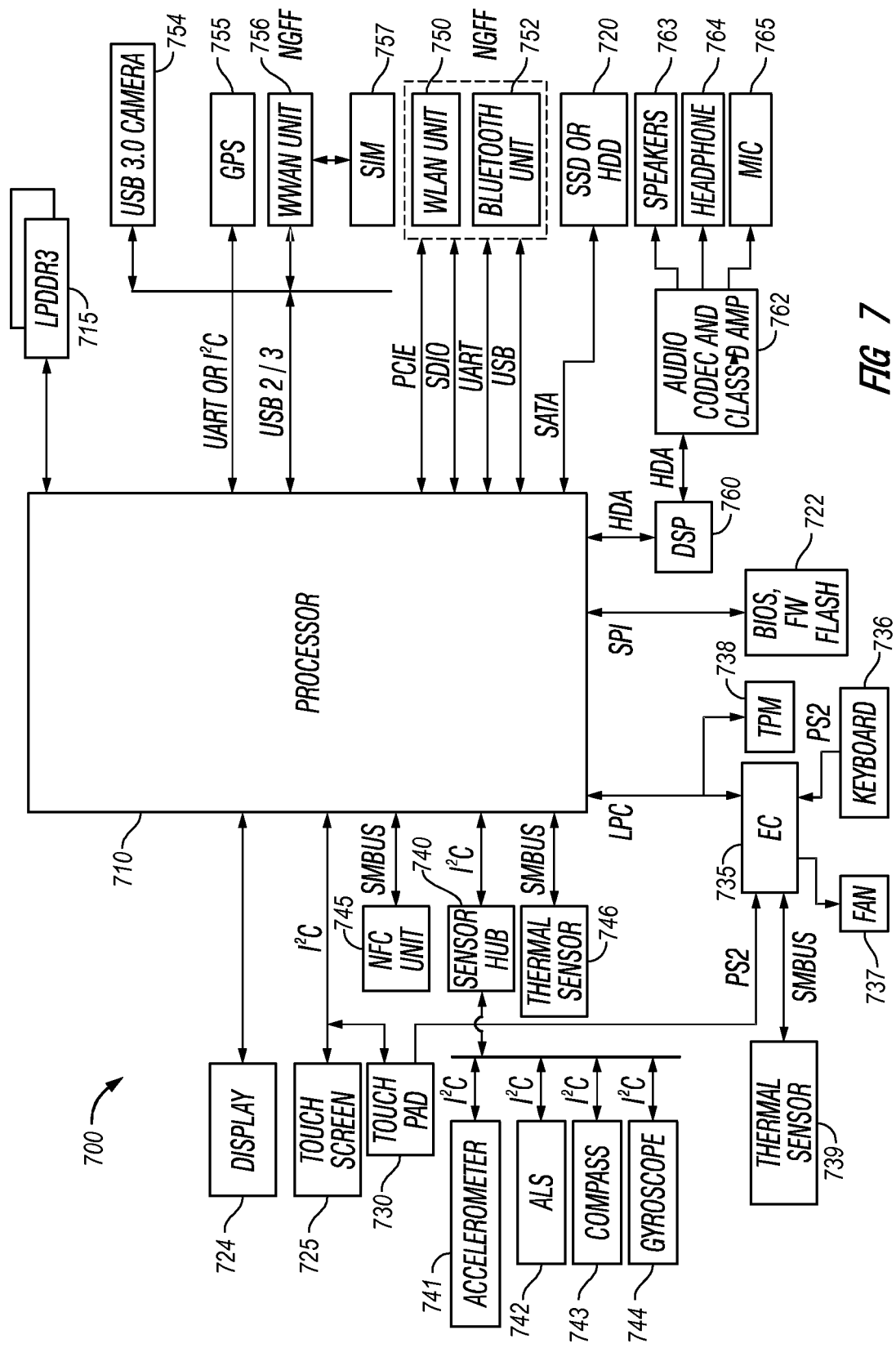
FIG. 7 is a block diagram of an embodiment of a SOC design in accordance with the present disclosure.

As seen in FIG. 7, a processor 710, in one embodiment, includes a microprocessor, multi-core processor, multi-threaded processor, an ultra-low voltage processor, an embedded processor, or other known processing element. In the illustrated implementation, processor 710 acts as a main processing unit and central hub for communication with many of the various components of the system 700. As one example, processor 700 is implemented as a system on a chip (SoC). As a specific illustrative example, processor 710 includes an Intel® Architecture Core™-based processor such as an Atom™, i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the micro architectural implementation may vary, but the architectural function of the processor is usually consistent. Certain details regarding the architecture and operation of processor 710 in one implementation will be discussed further below to provide an illustrative example.

Processor 710, in one embodiment, communicates with a system memory 715, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (1P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 720 may also couple to processor 710. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power-down events so that a fast power-up can occur on re-initiation of system activities. Also shown in FIG. 7, a flash device 722 may be coupled to processor 710, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 700. Specifically shown in the embodiment of FIG. 7 is a display 724 which may be a high definition LCD or LED panel configured within a lid portion of the chassis. This display panel may also provide for a touch screen 725, e.g., adapted externally over the display panel such that via a user's interaction with this touch screen, user inputs can be provided to the system to enable desired operations, e.g., with regard to the display of information, accessing of information and so forth. In one embodiment, display 724 may be coupled to processor 710 via a display interconnect that can be implemented as a high performance graphics interconnect. Touch screen 725 may be coupled to processor 710 via another interconnect, which in an embodiment can be an $I^2C$ interconnect. As further shown in FIG. 7, in addition to touch screen 725, user input by way of touch can also occur via a touch pad 730 which may be configured within the chassis and may also be coupled to the same $I^2C$ interconnect as touch screen 725.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920× 1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 710 in different manners. Certain inertial and environmental sensors may couple to processor 710 through a sensor hub 740, e.g., via an I²C interconnect. In the embodiment shown in FIG. 7, these sensors may include an accelerometer 741, an ambient light sensor (ALS) 742, a compass 743 and a gyroscope 744. Other environmental sensors may include one or more thermal sensors 746 which in some embodiments couple to processor 710 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, is realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra-idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 7, various peripheral devices may couple to processor 710 via a low pin count (LPC) interconnect. In the embodiment shown, various components can be coupled through an embedded controller 735. Such components can include a keyboard 736 (e.g., coupled via a PS2 interface), a fan 737, and a thermal sensor 739. In some embodiments, touch pad 730 may also couple to EC 735 via a PS2 interface. In addition, a security processor such as a trusted platform module (TPM) 738 in accordance with the Trusted Computing Group (TCG) TPM Specification Version 1.2, dated Oct. 2, 2003, may also couple to processor 710 via this LPC interconnect. However, understand the scope of the present invention is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 700 can communicate with external devices in a variety of manners, including wirelessly. In the embodiment shown in FIG. 7, various wireless modules, each of which can correspond to a radio configured for a particular wireless communication protocol, are present. One manner for wireless communication in a short range such as a near field may be via a near field communication (NFC) unit 745 which may communicate, in one embodiment with processor 710 via an SMBus. Note that via this NFC unit 745, devices in close proximity to each other can communicate. For example, a user can enable system 700 to communicate with another (e.g.,) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 7, additional wireless units can include other short range wireless engines including a WLAN unit 750 and a Bluetooth unit 752. Using WLAN unit 750, Wi-Fi™ communications in accordance with a given Institute of Electrical and Electronics Engineers (IEEE) 802.11 standard can be realized, while via Bluetooth unit 752, short range communications via a Bluetooth protocol can occur. These units may communicate with processor 710 via, e.g., a USB link or a universal asynchronous receiver transmitter (UART) link. Or these units may couple to processor 710 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 756 which in turn may couple to a subscriber identity module (SIM) 757. In addition, to enable receipt and use of location information, a GPS module 755 may also be present. Note that in the embodiment shown in FIG. 7, WWAN unit 756 and an integrated capture device such as a camera module 754 may communicate via a given USB protocol such as a USB 2.0 or 3.0 link, or a UART or I$^2$C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 760, which may couple to processor 710 via a high definition audio (HDA) link. Similarly, DSP 760 may communicate with an integrated coder/decoder (CODEC) and amplifier 762 that in turn may couple to output speakers 763 which may be implemented within the chassis. Similarly, amplifier and CODEC 762 can be coupled to receive audio inputs from a microphone 765 which in an embodiment can be implemented via dual array microphones (such as a digital microphone array) to provide for high quality audio inputs to enable voice-activated control of various operations within the system. Note also that audio outputs can be provided from amplifier/CODEC 762 to a headphone jack 764. Although shown with these particular components in the embodiment of FIG. 7, understand the scope of the present invention is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 710 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 735. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered-down or off when the processor enters certain deep sleep states, the sustain power plane remains powered-on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered=-on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered-on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 735 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 7, understand the scope of the present invention is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours. A platform in one implementation may have an energy capacity of, e.g., 35 watt hours (Whr) for a Win8 CS using an SSD and (e.g.,) 40-44 Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Figure 8:
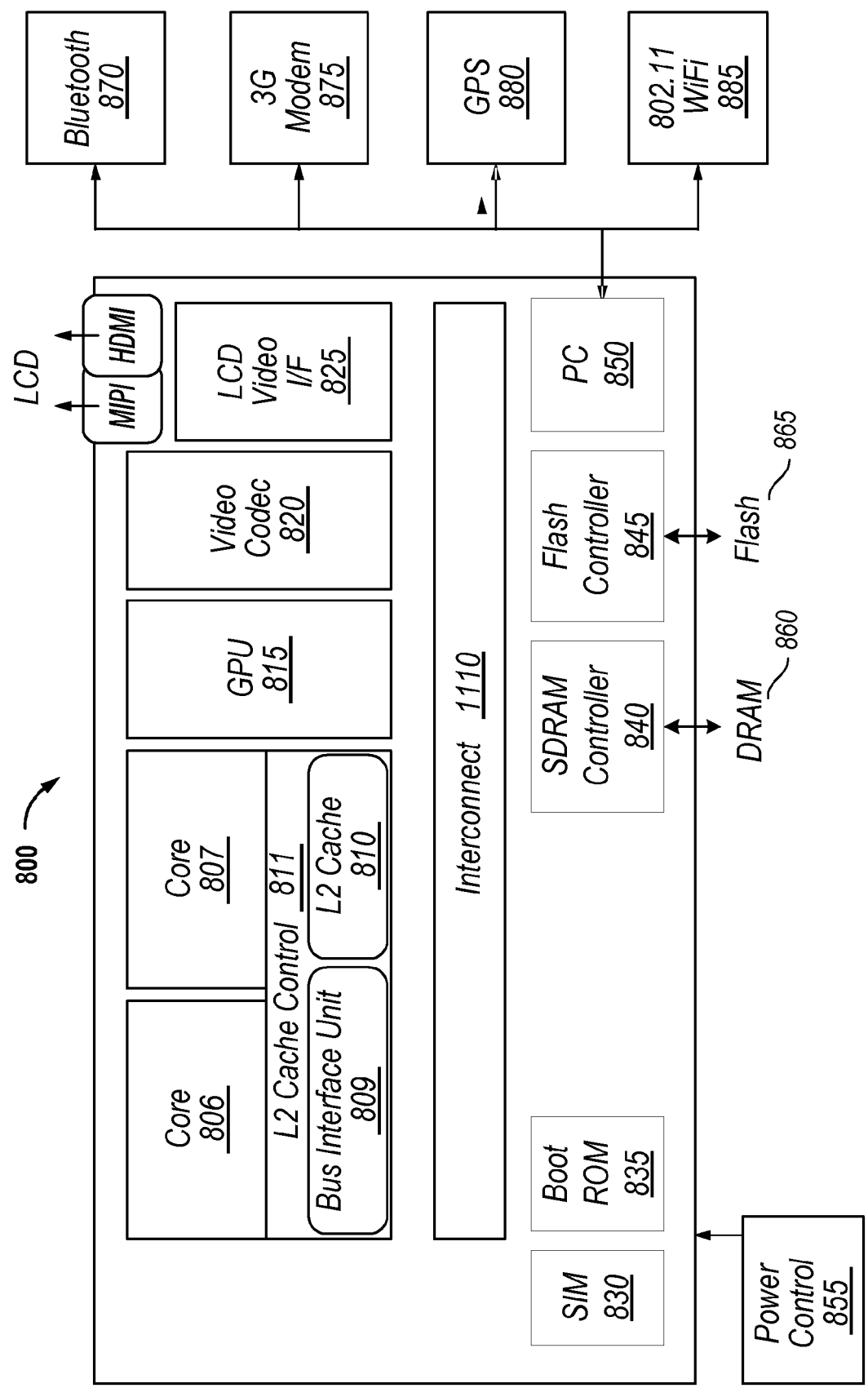
FIG. 8 is a block diagram of an embodiment of a SOC design in accordance with the present disclosure.

FIG. 8 is a block diagram of an embodiment of a system on-chip (SOC) design in accordance with the present disclosure. As a specific illustrative example, SOC 800 is included in communications equipment. In one embodiment, communications equipment refers to any device to support access to digital content, such as, and not limited to, a cable modem device, a gateway device, a gaming device, etc. In another specific illustrative example, SOC 800 is included in user equipment (UE). In one embodiment, UE refers to any device to be used by an end-user to communicate, such as a hand-held phone, smartphone, tablet, ultra-thin notebook, notebook with broadband adapter, or any other similar communication device.

Here, SOC 800 includes 2 cores—806 and 807. Cores 806 and 807 may conform to an Instruction Set Architecture, such as an Intel® Architecture Core™-based processor, an Atom™-based processor, an Advanced Micro Devices, Inc. (AMD) processor, a MIPS-based processor, an ARM-based processor design, or a customer thereof, as well as their licensees or adopters. Cores 806 and 807 are coupled to cache control 811 that is associated with bus interface unit 809 and L2 cache 810 to communicate with other parts of system 800. Interconnect 812 includes an on-chip interconnect, such as an OCP (Open Core Protocol), AMBA (Advanced Microcontroller Bus Architecture), or other interconnect discussed above, which potentially implements one or more aspects of the described disclosure.

Interconnect 812 provides communication channels to the other components, such as a Subscriber Identity Module (SIM) 830 to interface with a SIM card, a boot ROM 835 to hold boot code for execution by cores 806 and 807 to initialize and boot SOC 800, a SDRAM controller 840 to interface with external memory (e.g. DRAM 860), a flash controller 845 to interface with non-volatile memory (e.g. Flash 865), a peripheral control 850 (e.g. Serial Peripheral Interface) to interface with peripherals, video codecs 820 and Video interface 825 to display and receive input (e.g. touch enabled input), GPU 815 to perform graphics related computations, etc. Any of these interfaces may incorporate aspects of the disclosure described herein.

In addition, the system 800 illustrates peripherals for communication, such as a Bluetooth module 870, 3G modem 875, GPS 880, and Wi-Fi 885. Note as stated above, a UE includes a radio for communication. As a result, these peripheral communication modules are not all required. However, in a UE, some form of radio for external communication is to be included.

Figure 9:
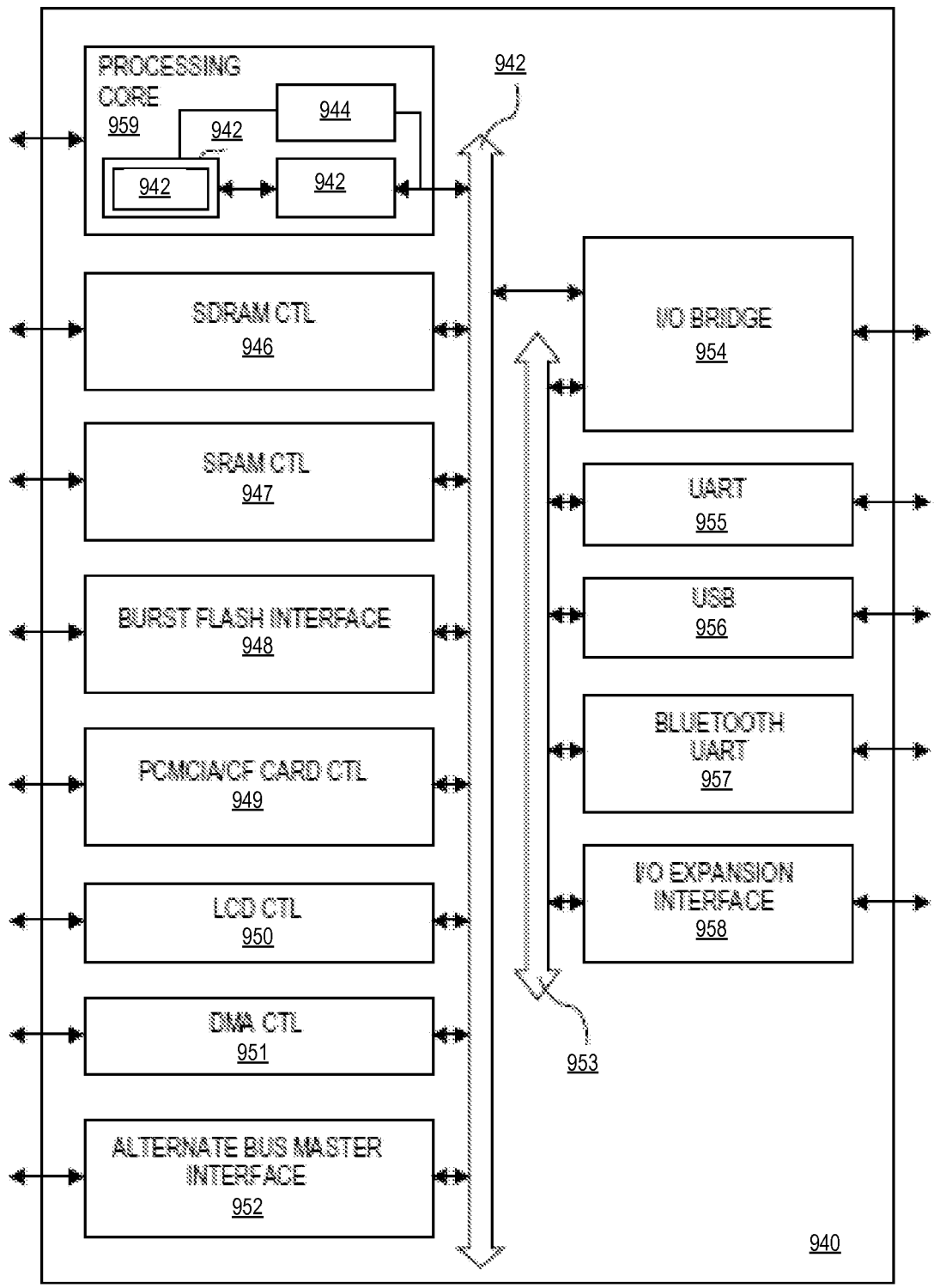
FIG. 9 is a block diagram of a system according to one embodiment.

FIG. 9 illustrates a data processing system 940 which implements the principles of one embodiment of the present invention. It will be readily appreciated by one of skill in the art that the embodiments described herein can be used with alternative processing systems without departure from the scope of embodiments of the invention.

Computer system 940 comprises a processing core 959 capable of performing at least one instruction in accordance with one embodiment. For one embodiment, processing core 959 represents a processing unit of any type of architecture, including but not limited to a CISC, a RISC or a VLIW type architecture. Processing core 959 may also be suitable for manufacture in one or more process technologies and by being represented on a machine readable media in sufficient detail, may be suitable to facilitate said manufacture.

Processing core 959 comprises an execution unit 942, a set of register file(s) 945, and a decoder 944. Processing core 959 also includes additional circuitry (not shown) which is not necessary to the understanding of embodiments of the present invention. Execution unit 942 is used for executing instructions received by processing core 959. In addition to performing typical processor instructions, execution unit 942 can perform instructions in packed instruction set 943 for performing operations on packed data formats. Packed instruction set 943 includes instructions for performing embodiments of the invention and other packed instructions. Execution unit 942 is coupled to register file 945 by an internal bus. Register file 945 represents a storage area on processing core 959 for storing information, including data. As previously mentioned, it is understood that the storage area used for storing the packed data is not critical. Execution unit 942 is coupled to decoder 944. Decoder 944 is used for decoding instructions received by processing core 959 into control signals and/or microcode entry points. In response to these control signals and/or microcode entry points, execution unit 942 performs the appropriate operations. In one embodiment, the decoder is used to interpret the opcode of the instruction, which will indicate what operation should be performed on the corresponding data indicated within the instruction.

Processing core 959 is coupled with bus 941 for communicating with various other system devices, which may include but are not limited to, for example, synchronous dynamic random access memory (SDRAM) control 946, static random access memory (SRAM) control 947, burst flash memory interface 948, personal computer memory card international association (PCMCIA)/compact flash (CF) card control 949, liquid crystal display (LCD) control 950, direct memory access (DMA) controller 951, and alternative bus master interface 952. In one embodiment, data processing system 940 may also comprise an I/O bridge 954 for communicating with various I/O devices via an I/O bus 953. Such I/O devices may include but are not limited to, for example, universal asynchronous receiver/transmitter (UART) 955, universal serial bus (USB) 956, Bluetooth wireless UART 957 and I/O expansion interface 958.

One embodiment of data processing system 940 provides for mobile, network and/or wireless communications and a processing core 959 capable of performing SIMD operations including a text string comparison operation. Processing core 959 may be programmed with various audio, video, imaging and communications algorithms including discrete transformations such as a Walsh-Hadamard transform, a fast Fourier transform (FFT), a discrete cosine transform (DCT), and their respective inverse transforms; compression/decompression techniques such as color space transformation, video encode motion estimation or video decode motion compensation; and modulation/demodulation (MODEM) functions such as pulse coded modulation (PCM).

Figure 10A:
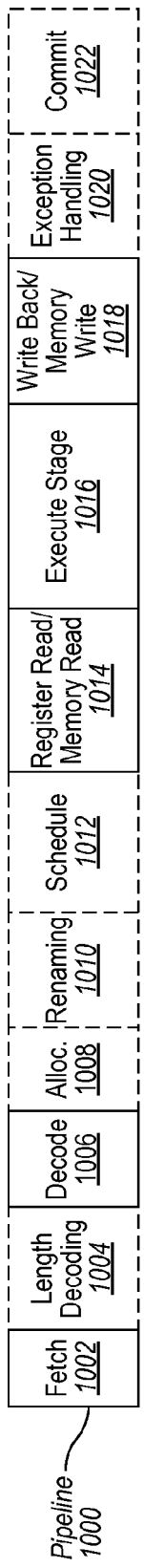
FIG. 10A illustrates elements of a processor micro-architecture according to one embodiment.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

Figure 10B:
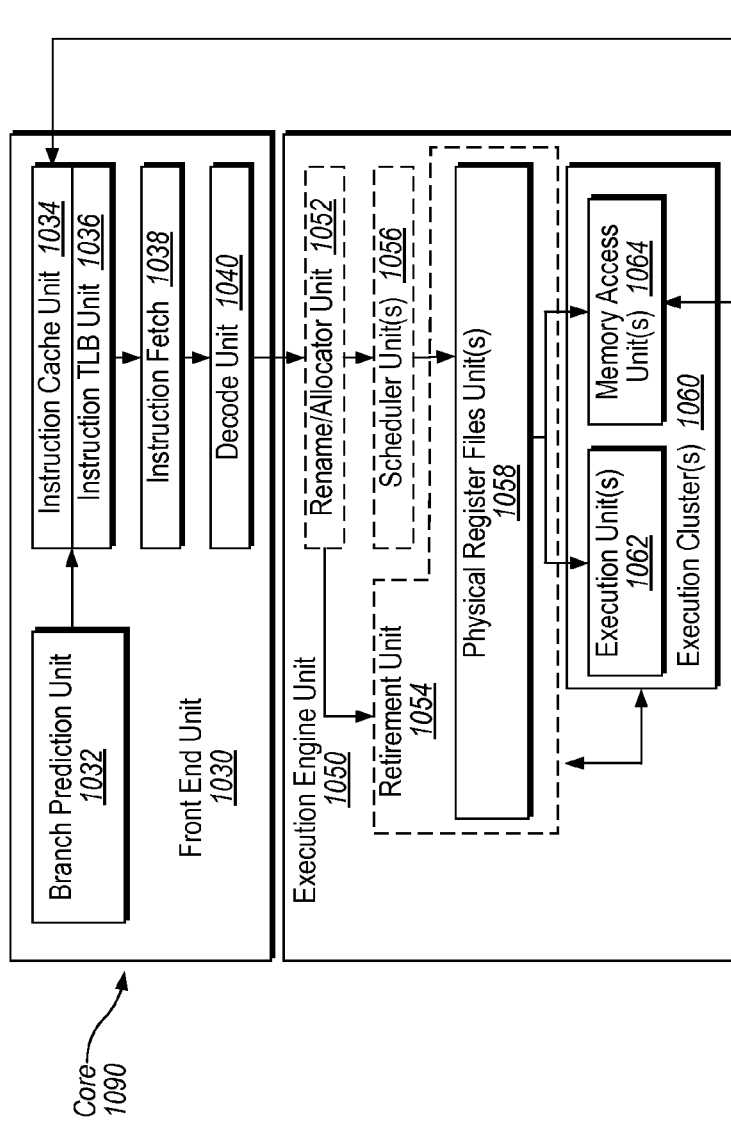
FIG. 10B illustrates elements of a processor micro-architecture according to one embodiment.

In FIG. 10B, arrows denote a coupling between two or more units and the direction of the arrow indicates a direction of data flow between those units. FIG. 10B shows processor core 1090 including a front end unit 1030 coupled to an execution engine unit 1050, and both are coupled to a memory unit 1070.

The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 1034 is further coupled to a level 2 (L2) cache unit 1076 in the memory unit 1070. The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 1058 is overlapped by the retirement unit 1054 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster— and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 11:
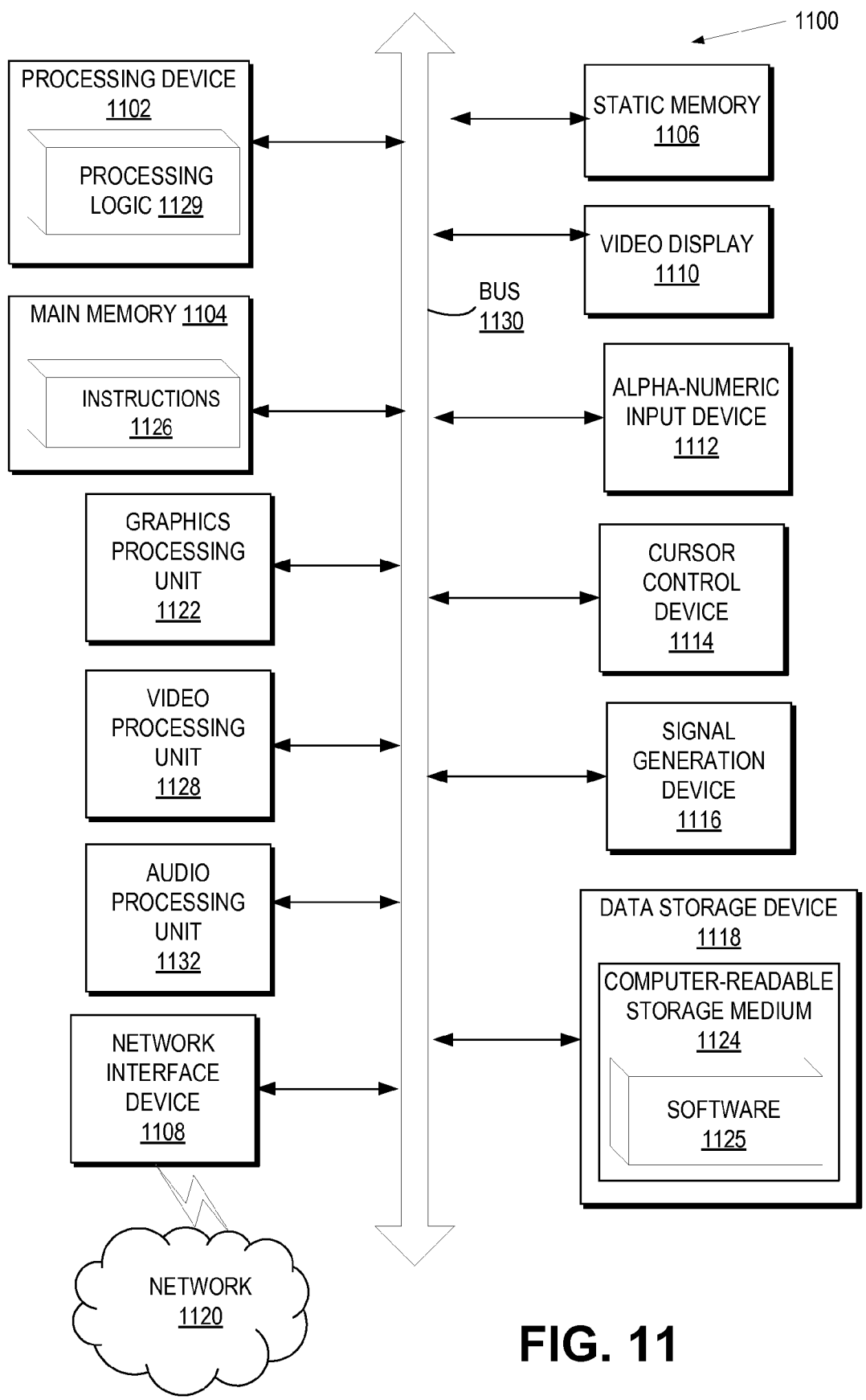
FIG. 11 illustrates a diagrammatic representation of a machine in the example form of a computer system within which a set of instructions, for causing the machine to perform any one or more of the methodologies discussed herein, may be executed.

FIG. 11 illustrates a representation of a machine in the example form of a computer system 1100 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computer system 1100 includes a processing device 1102, a main memory 1104 (e.g., read-only memory (ROM), flash memory, dynamic random access memory (DRAM) (such as synchronous DRAM (SDRAM) or DRAM, etc.), a static memory 1106 (e.g., flash memory, static random access memory (SRAM), etc.), and a data storage device 1118, which communicate with each other via a bus 1130.

Processing device 1102 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In one embodiment, processing device 1102 may include one or more processing cores. The processing device 1102 is configured to execute the processing logic 1126 for performing the operations discussed herein. In one embodiment, processing device 1102 is the same as the CPU of FIG. 1 that implements the fast recalibration circuitry 100. In another embodiment, processing device 1102 implements the fast recalibration circuitry 300 of FIG. 3.

The computer system 1100 may further include a network interface device 1108 communicably coupled to a network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a signal generation device 1116 (e.g., a speaker), or other peripheral devices. Furthermore, computer system 1100 may include a graphics processing unit 1122, a video processing unit 1128, and an audio processing unit 1132. In another embodiment, the computer system 1100 may include a chipset (not illustrated), which refers to a group of integrated circuits, or chips, that are designed to work with the processing device 1102 and controls communications between the processing device 1102 and external devices. For example, the chipset may be a set of chips on a motherboard that links the processing device 1102 to very high-speed devices, such as main memory 1104 and graphic controllers, as well as linking the processing device 1102 to lower-speed peripheral buses of peripherals, such as USB, PCI or ISA buses.

The data storage device 1118 may include a computer-readable storage medium 1124 on which is stored software 1125 embodying any one or more of the methodologies of functions described herein. The software 1125 may also reside, completely or at least partially, within the main memory 1104 as instructions 1126 and/or within the processing device 1102 as processing logic 1127 during execution thereof by the computer system 1100; the main memory 1104 and the processing device 1102 also constituting computer-readable storage media.

The computer-readable storage medium 1124 may also be used to store instructions 1126 utilizing the fast recalibration circuitry, such as described with respect to FIG. 1, FIG. 2, FIG. 3, and FIG. 4, and/or a software library containing methods that call the above applications. While the computer-readable storage medium 1124 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is an apparatus for input/output (IO) compensation for power-down exit comprising 1) a finite state machine comprising a volatile memory to store an IO compensation setting and a power supply coupled to the volatile memory to provide power to the volatile memory; 2) a persistent memory coupled to the volatile memory; and 3) one or more circuits, coupled to the volatile memory and the persistent memory, to identify an event to enter a power-down mode, wherein the power-down mode comprises the power supply removing power from the volatile memory and transfer the IO compensation setting in the volatile memory to the persistent memory prior to the power supply removing the power from the volatile memory.

In Example 2, the subject matter of Example 1 can optionally further comprise one or more circuits to identify an event to exit the power-down mode and reload the IO compensation setting from the persistent memory into the finite state machine in response to the event to exit the power-down mode.

In Example 3, the one or more circuits of the subject matter of Example 2 can optionally comprise a reload register to store the IO compensation setting that is stored in the persistent memory, wherein the reload register reloads the IO compensation setting into the finite state machine in response to the event to exit the power-down mode.

In Example 4, the subject matter of Example 2 can optionally comprise a digital filter circuit to remove signal noise from the IO compensation setting that is reloaded into the finite state machine, wherein the digital filter circuit performs a first set of filtering operations corresponding to the finite state machine being in a normal compensation state and the digital filter circuit performs a second set of filtering operations corresponding to the finite state machine being in a fast compensation state.

In Example 5, the subject matter of Example 2 can optionally comprise a variable step circuit to adjust a step size for the IO compensation setting that is reloaded into the finite state machine, wherein the variable step circuit performs a first set of step size adjustments corresponding to the finite state machine being in a normal compensation state and the variable step circuit performs a second set of step size adjustments corresponding to the finite state machine being in a fast compensation state.

In Example 6, the subject matter of Example 1 can optionally comprise a control circuit to set a compensation state of the finite state machine to one of a plurality of compensation states.

In Example 7, the compensations states of the subject matter of Example 6 can optionally comprise a fast compensation state and a normal compensation state.

In Example 8, the control circuit of the subject matter of Example 7 can optionally control whether the IO compensation setting that is stored in the persistent memory is to be reloaded into the finite state machine.

In Example 9, the one or more circuits of the subject matter of Example 1 can optionally comprise a save register to store the IO compensation setting that is stored in the settings register, wherein the IO compensation setting the save register is transferred to the persistent memory.

In Example 10, the subject matter of Example 1 can optionally comprise a second power supply to supply power to the persistent memory.

Various embodiments may have different combinations of the operational features described above. For instance, all optional features of the apparatus described above may also be implemented with respect to the method or process described herein and specifics in the examples may be used anywhere in one or more embodiments.

Example 11 is a method for input/output (IO) compensation for power-down exit comprising 1) identifying an event to enter a power-down mode, wherein the power-down mode comprises a power supply removing power from a volatile memory in a finite state machine; 2) transferring the IO compensation setting in the volatile memory to the persistent memory prior to the power supply removing the power from the volatile memory; 3) identifying an event to exit the power-down mode; and 4) reloading the IO compensation setting from the persistent memory into the finite state machine in response to the event to exit the power-down mode.

In Example 12, the reloading subject matter of Example 12 can optionally comprise transferring the IO compensation setting that is stored in the persistent memory to a reload register; and reloading the IO compensation setting from the reload register into the finite state machine in response to the event to exit the power-down mode.

In Example 13, the subject matter of Example 11 can optionally comprise setting a compensation state of the finite state machine to one of a plurality of compensation states, wherein the plurality of compensations states comprises a fast compensation state and a normal compensation state.

In Example 14, the subject matter of Example 13 can optionally comprise performing a first set of filtering operations in response to the finite state machine being in the normal compensation state; and performing a second set of filtering operations in response to the finite state machine being in the fast compensation state.

In Example 15, the subject matter of Example 13 can optionally comprise performing a first set of step size adjustments to adjust a step size for the IO compensation setting that is reloaded into the finite state machine in response to the finite state machine being in the normal compensation state; and performing a second set of step size adjustments to adjust the step size for the IO compensation setting that is reloaded into the finite state machine in response to the finite state machine being in the fast compensation state.

In Example 16, the subject matter of Example 11 can optionally comprise setting a control to reload the IO compensation setting that is stored in the persistent memory into the finite state machine in response to transferring the IO compensation setting in the volatile memory to the persistent memory prior to the power supply removing the power from the volatile memory.

Various embodiments may have different combinations of the operational features described above. For instance, all optional features of the method described above may also be implemented with respect to a non-transitory, computer-readable storage medium. Specifics in the examples may be used anywhere in one or more embodiments.

Examples 17-22 are a non-transitory, computer-readable storage medium including instructions that, when executed by a computing system, cause the computing system to perform the operations of Examples 11-16.

Various embodiments may have different combinations of the operational features described above. For instance, all optional features of the method described above may also be implemented with respect to an apparatus. Specifics in the examples may be used anywhere in one or more embodiments.

Examples 23-28 are an apparatus for input/output (IO) compensation for power-down exit comprising means for executing the operations of Examples 11-16.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying," "transferring," "reloading," "setting," "performing," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the operations. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. An apparatus for input/output (IO) compensation for power-down exit comprising:
    a finite state machine comprising:
        a volatile memory to store an IO compensation setting;
        a power supply coupled to the volatile memory to provide power to the volatile memory;
    a persistent memory coupled to the volatile memory;
    one or more circuits, coupled to the volatile memory and the persistent memory, to
        identify an event to enter a power-down mode, wherein the power-down mode comprises the power supply removing power from the volatile memory; and
        transfer the IO compensation setting in the volatile memory to the persistent memory prior to the power supply removing the power from the volatile memory; and
    a multiplexer coupled to the finite state machine to change a compensation state of the finite state machine from a normal compensation state to a fast compensation state based on the IO compensation setting in the persistent memory, wherein the fast compensation state is associated with calibration parameters that are different from calibration parameters associated with the normal compensation state.

2. The apparatus of claim 1, further comprising one or more circuits to:
    identify an event to exit the power-down mode; and
    reload the IO compensation setting from the persistent memory into the finite state machine in response to the event to exit the power-down mode.

3. The apparatus of claim 2, wherein the one or more circuits comprises:
    a reload register to store the IO compensation setting that is stored in the persistent memory, wherein the reload register reloads the IO compensation setting into the finite state machine in response to the event to exit the power-down mode.

4. The apparatus of claim 2, further comprising:
    a digital filter circuit to remove signal noise from the IO compensation setting that is reloaded into the finite state machine, wherein the digital filter circuit performs a first set of filtering operations corresponding to the finite state machine being in the normal compensation state and the digital filter circuit performs a second set of filtering operations corresponding to the finite state machine being in the fast compensation state.

5. The apparatus of claim 2, further comprising:
    a variable step circuit to adjust a step size for the IO compensation setting that is reloaded into the finite state machine, wherein the variable step circuit performs a first set of step size adjustments corresponding to the finite state machine being in the normal compensation state and the variable step circuit performs a second set of step size adjustments corresponding to the finite state machine being in the fast compensation state.

6. The apparatus of claim 1, further comprising:
    a control circuit coupled to the multiplexer to provide input to the multiplexer to set the finite state machine in the fast compensation state or the normal compensation state, and wherein the control circuit is further to control whether the IO compensation setting that is stored in the persistent memory is to be reloaded into the finite state machine.

7. The apparatus of claim 1, wherein the one or more circuits comprises:
    a save register to store the IO compensation setting that is stored in a settings register, wherein the IO compensation setting the save register is transferred to the persistent memory.

8. The apparatus of claim 1, further comprising:
    a second power supply to supply power to the persistent memory.

9. A method for input/output (IO) compensation for power-down exit comprising:
    identifying an event to enter a power-down mode, wherein the power-down mode comprises a power supply removing power from a volatile memory in a finite state machine;
    transferring an IO compensation setting in the volatile memory to persistent memory prior to the power supply removing the power from the volatile memory;
    identifying an event to exit the power-down mode;
    reloading the IO compensation setting from the persistent memory into the finite state machine in response to the event to exit the power-down mode; and
    changing a compensation state of the finite state machine from a normal compensation state to a fast compensation state in response to the IO compensation setting in the persistent memory being reloaded in the finite state machine, wherein the fast compensation state uses calibration parameters that are different from calibration parameters of the normal compensation state.

10. The method of claim 9, wherein reloading comprises:
    transferring the IO compensation setting that is stored in the persistent memory to a reload register; and
    reloading the IO compensation setting from the reload register into the finite state machine in response to the event to exit the power-down mode.

11. The method of claim 9, further comprising:
    performing a first set of filtering operations in response to the finite state machine being in the normal compensation state; and
    performing a second set of filtering operations in response to the finite state machine being in the fast compensation state.

12. The method of claim 9, further comprising:
    performing a first set of step size adjustments to adjust a step size for the IO compensation setting that is reloaded into the finite state machine in response to the finite state machine being in the normal compensation state; and performing a second set of step size adjustments to adjust the step size for the IO compensation setting that is reloaded into the finite state machine in response to the finite state machine being in the fast compensation state.

13. The method of claim 9, further comprising:
setting a control to reload the IO compensation setting that is stored in the persistent memory into the finite state machine in response to transferring the IO compensation setting in the volatile memory to the persistent memory prior to the power supply removing the power from the volatile memory.

14. A non-transitory, computer-readable storage medium including instructions that, when executed by a computing system, cause the computing system to perform operations comprising:
identifying, by a processor in the computing system, an event to enter a power-down mode, wherein the power-down mode comprises a power supply removing power from a volatile memory in a finite state machine;
transferring an IO compensation setting in the volatile memory to persistent memory prior to the power supply removing the power from the volatile memory;
identifying an event to exit the power-down mode;
reloading the IO compensation setting from the persistent memory into the finite state machine in response to the event to exit the power-down mode; and
changing a compensation state of the finite state machine from a normal compensation state to a fast compensation state in response to the IO compensation setting in the persistent memory being reloaded in the finite state machine, wherein the fast compensation state uses calibration parameters that are different from calibration parameters of the normal compensation state.

15. The storage medium of claim 14, wherein reloading comprises:
transferring the IO compensation setting that is stored in the persistent memory to a reload register; and
reloading the IO compensation setting from the reload register into the finite state machine in response to the event to exit the power-down mode.

16. The storage medium of claim 14, the operations further comprising:
performing a first set of filtering operations in response to the finite state machine being in the normal compensation state; and
performing a second set of filtering operations in response to the finite state machine being in the fast compensation state.

17. The storage medium of claim 14, the operations further comprising:
performing a first set of step size adjustments to adjust a step size for the IO compensation setting that is reloaded into the finite state machine in response to the finite state machine being in the normal compensation state; and
performing a second set of step size adjustments to adjust the step size for the IO compensation setting that is reloaded into the finite state machine in response to the finite state machine being in the fast compensation state.

18. The storage medium of claim 14, further comprising:
setting a control to reload the IO compensation setting that is stored in the persistent memory into the finite state machine in response to transferring the IO compensation setting in the volatile memory to the persistent memory prior to the power supply removing the power from the volatile memory.

\* \* \* \* \*